United States Patent [19]

Auracher

[11] 3,969,014
[45] July 13, 1976

[54] PHOTORESIST LAYER WAVEGUIDE COUPLING DEVICE

[75] Inventor: Franz Auracher, Munich, Germany

[73] Assignee: Siemens Aktiengesellschaft, Berlin & Munich, Germany

[22] Filed: Dec. 16, 1974

[21] Appl. No.: 533,323

[30] Foreign Application Priority Data
Dec. 19, 1973 Germany............................ 2363253

[52] U.S. Cl. ........................ 350/96 C; 350/96 WG; 96/27 R
[51] Int. Cl.² ........................................... G02B 5/14
[58] Field of Search ..................... 350/96 C, 96 WG

[56] References Cited
UNITED STATES PATENTS
3,756,688 9/1973 Hudson et al..................... 350/96 C 3,864,016 2/1975 Dakss et al..................... 350/96 WG

OTHER PUBLICATIONS

D. B. Ostrowsky et al, "Formation of Optical Waveguides in Photoresist Films," *Applied Physics Letters*, vol. 18, No. 12, June 15, 1971, pp. 556–557.
S. Somekh et al., "Channel Optical Waveguide Directional Couplers," *Applied Physics Letters*, Jan. 15, 1973, vol. 22, No. 2, pp. 216–217.

*Primary Examiner*—John K. Corbin
*Assistant Examiner*—Stewart Levy
*Attorney, Agent, or Firm*—Hill, Gross, Simpson, Van Santen, Steadman, Chiara & Simpson

[57] ABSTRACT

A coupling device for coupling light waves between optical components for signal transmission including a developed, transparent, negative photoresist layer interposed between the optical components to be coupled.

10 Claims, 4 Drawing Figures

PHOTORESIST LAYER WAVEGUIDE COUPLING DEVICE

BACKGROUND OF THE INVENTION

This invention relates to a coupling device for light waves transmitted between optical components for signal transmission and to a process for the production thereof.

In optical signal transmission by means of light guides, light signals which are produced in a transmitter may be input and output coupled to intermediate elements such as modulators or intermediate amplifiers and receivers. The radiation energy of the light signals should be transmitted as fully as possible between one of the above mentioned intermediate elements and the light conductors. For this purpose coupling devices are required. One of the characteristics of such coupling devices is that they be favorably adapted for the light transmission.

In order, for example, to couple the input of light emitted from a laser diode into a light guide having a small circular cross-section with good efficiency, a lens system can be constructed between the light inlet and outlet surface. This, however, requires very expensive adjustment measures as the diameters of optical wave guides are usually between 5μm and 100μm.

Accordingly, it becomes desirable to have a coupling device for guiding light between wave guiding components which is simple to produce.

SUMMARY OF THE INVENTION

An object of the invention is to provide a coupling device for guiding light between wave guiding components which is of the appropriate shape and easy to produce.

Another object of the invention is to provide a coupling device wherein the index of refraction of the coupling material is the same as the index of refraction of the adjoining components.

Another object of the invention is to surround the coupling material with a transparent solid substance which has an index of refraction which is lower than that of the coupling material.

Another object of the invention is to provide coupling devices which will permit the coupling of light signals between light guiding fibers and terminal devices.

Another object of the invention is to provide a coupling device to be disposed between wave guiding components which is formed as a continuous light guiding junction, the end faces of the coupling device being matched to the optical components to be coupled.

Other objects and advantages of the invention will become more apparent when considering the following description and accompanying drawings.

DESCRIPTION OF PREFERRED EMBODIMENT

Figure 1:
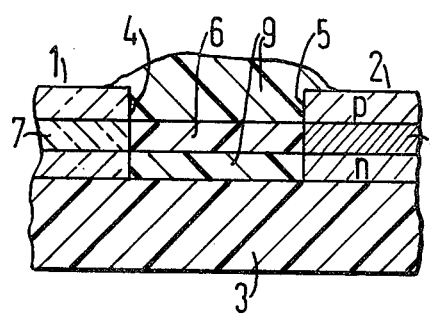
FIG. 1 is a side view in elevation of a coupling device for light waves embodying the invention herein.

One of the purposes of this invention is to provide a coupling device of the correct shape for guiding light between wave guiding components and which is simple to produce.

This purpose is accomplished in accordance with the invention by a developed, transparent, negative photoresist layer having low optical attenuation which is arranged between at least two components and which is formed as a continuous light guiding junction, the end faces of which are matched or mated to the optical components which are to be coupled.

When light is coupled between a wave guiding component and a plurality of other wave guiding components, the latter are arranged closely adjacent to one another. The light entry surface of the photoresist layer here is matched with, that is, is coextensive with the light outlet surface of the individual component and the light outlet surface of the photoresist layer is also coextensive with the total surface which is formed by all the adjoining, closely adjacent components.

The material chosen for the photoresist layer is in particular one which ensures that the index of refraction of the photoresist layer is matched to the indices of refraction of the adjoining components in order to avoid light losses through reflection and scattering. The surface roughness of their light entry surfaces does not reduce the signal energies which are to be transmitted.

The photoresist layer serves to couple light signals between light guiding fibers and terminal devices or of light guiding paths arranged on a substrate and terminal devices. In the latter case the air surrounding the photoresist layer forms a medium which has an index of refraction which is smaller than that of the photoresist layer so that light signals are guided in the photoresist layer as in the core of a cladded core fiber.

When light guiding fibers are coupled to terminal devices, the photoresist layer can advantageously be surrounded by a solid substance whose index of refraction is lower than that of the photoresist layer. Such a solid substance provides the components which are to be coupled with a mechanical stability in addition to their wave-guiding function.

Advantageously the light guiding fiber or the light guide which is arranged in strip form on the substrate and which is to be coupled is itself used for the production of the coupling device. The light guide is in particular arranged in the beam path in front of the component which is to be coupled where it is adjusted. The photoresist is interposed between the light guide and the adjoining components and is exposed via the light guide to light which has a wave length compatible with the photoresist. Then the photoresist layer is developed, the non-exposed parts being removed.

The shape which is matched to the geometry of the components to be coupled is achieved in particular by the light distribution entering the photoresist layer from the light guide. For this purpose in front of the light guide there can be constructed an optical arrangement provided with a suitable aperture for radiating the light into the light guide, or the light exit surface of the light guide can be shaped in such a way that it produces a suitable lens effect.

For mechanical stabilization with photo-lacquer layer can advantageously be surrounded with a solid transparent substance whose index of refraction is lower than that of the photoresist layer.

The invention will now be explained in detail making reference to exemplary embodiments shown in the drawings.

FIG. 1 illustrates a coupling device for the waveguide connection of a cladded core fibre 1 to a laser diode 2. These two components are permanently arranged on a substrate 3. Between the end faces 4 of the cladded core fibre 1 and 5 of the laser diode 2 is arranged a photoresist layer 6, shaped in such manner that its cross-sectional end faces are identical to the cross-sectional face of the core 7 of the cladded core fibre and to the cross-sectional face of the p-n junction zone 8 of the laser diode. The photoresist zone 6 is surrounded by a substance 9 which has a lower index of refraction than that of the photoresist layer. A light wave emitted from the laser diode 2 is thus precisely input coupled into the adjoining cladded core fibre on the left-hand side by means of this coupling device as if by a light wave guide.

Figure 2:
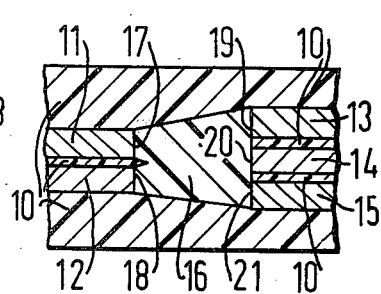
FIG. 2 is a side view in elevation of a coupling device for coupling two light guides to three adjacent light guides.

FIG. 2 shows two light guiding paths 11 and 12 on a substrate 10. The light signals carried by these two light guiding paths are to be input coupled into the three light guiding paths 13, 14 and 15 arranged on the substrate 10. This is effected by the photoresist layer 16 whose light inlet faces and light outlet faces are of such size that they are the same as the total area formed from the end faces 17 and 18 of the conductor paths 11, 12 on the one side and the total area of the conductor paths 13, 14 and 15 formed by the end faces 19, 20 and 21 on the other side.

Figure 3:
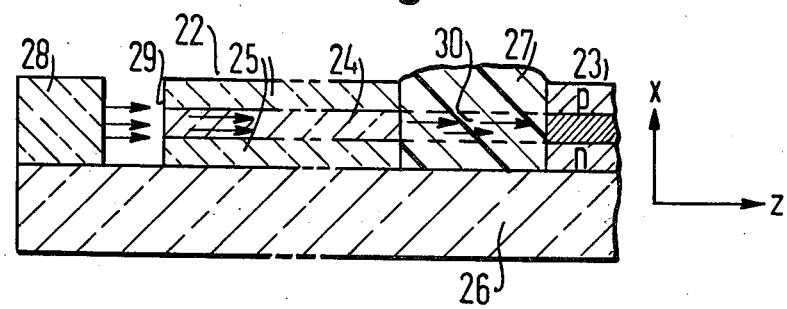
FIG. 3 is a side view in elevation of a coupling device for coupling a light guide to a laser diode.
Figure 4:
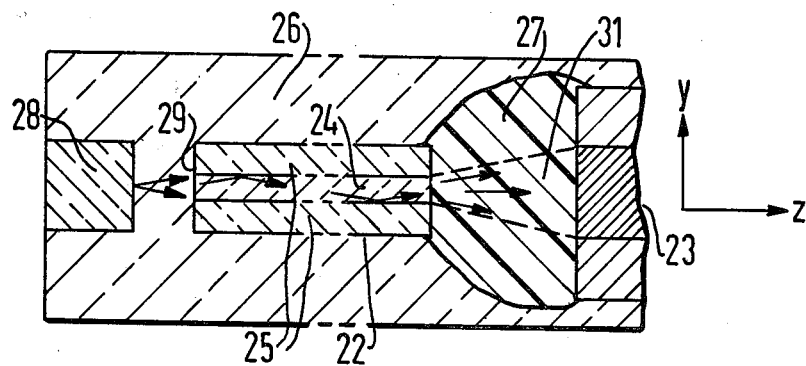
FIG. 4 is a top view of the device shown in FIG. 3.

FIGS. 3 and 4 show a construction for the production of a coupling device between a light guide 22 and a laser diode 23 in a side view and a top view, respectively. The light guide 22 is a cladded core fibre with a core 24 and a cladding 25. The two components 22 and 23 are secured and adjusted on a substrate 26. The space between them is filled with a photoresist layer 27. On the substrate 26, on the left in front of the light guide 22 is arranged an optical system 28 which transmits a plurality of light rays to the end face 29 of the light guide 22 distributed in such manner that it hits the light guide 22 parallel in the xz plane (FIG. 3) and divergently in the yz plane (FIG. 4). Then the plurality of light rays, which propagate in the guide by means of total internal reflection, spans only a very small angle with the guide axis in the xz plane but a bigger one in the yz plane. When this plurality of light rays emerges from the light conductor 22 it passes through the photoresist layer 27 in such manner that, in accordance with FIG. 3, the photo-lacquer layer 27 is exposed to light approximately in parallel as indicated by arrows 30 and in accordance with FIG. 4 in an expanding area 31.

In the case of light guides 22 in which the core and the cladding have given indexes of refraction, the spacing between the light conductor 22 and the end device 23 is determined experimentally in that the light inlet and outlet faces of these components are identical to the two end faces of the exposed photoresist layer. The distances between the components, i.e. the length of the photoresist layer is of the order of a few tenths of a millimeter.

During the subsequent development of the photoresist layer its non-exposed parts are removed. The remaining exposed part of the photoresist layer acts in the manner of the core of a cladded core fibre whose cladding is air with an index of refraction smaller than that of the core.

In order to form a given ratio of the index of refraction of this core and a surrounding cladding and in order to mechanically stabilize the coupling device, this core can be surrounded by a transparent solid substance having a suitable index of refraction.

The effect of this coupler is to cause a light pulse emitted from the laser diode 23 to be accurately input coupled into the light guide 22 with low losses. The light guides can be cladded core fibres or graded index fibres.

What is claimed is:

1. A coupling device for the transfer of light transmissions containing signals between optical components comprising a substrate, two optical components each having an end face, said components having a portion adjacent its end face disposed on the substrate with the end faces of the two components being in spaced relationship, a developed, transparent, negative photoresist layer disposed on the substrate between said end faces and in contact therewith, said photo-resist layer being formed so that its end faces are matched and coextensive with the end faces of the optical components to form a continuous light guiding junction therebetween.

2. The coupling device of claim 1 wherein
said photoresist layer has a low optical attenuation.

3. The coupling device of claim 1 wherein
the index of refraction of the photoresist layer is matched to the index of refraction of the adjoining two optical components.

4. The coupling device of claim 1 wherein
the optical components are light guiding fibers and terminal devices.

5. The coupling device of claim 1 wherein
the optical components are light guiding paths and terminal devices, the light guiding paths being arranged in integrated optical fashion on the substrate.

6. The coupling device of claim 1 wherein
the index of refraction of the photoresist layer is matched to the index of refraction of the adjoining two optical components and further includes a transparent solid substance which surrounds the photoresist layer;
the index of refraction of the transparent solid substance being lower than that of the photoresist layer.

7. The coupling device of claim 1 wherein
the index of refraction of the photoresist layer is matched to the index of refraction of the adjoining two optical components; and
the optical components are light guiding fibers and terminal devices.

8. The coupling device of claim 1 wherein
the index of refraction of the photoresist layer is matched to the index of refraction of the adjoining two optical components; and
the optical components are light guiding paths and terminal devices, the light guiding paths being arranged in integrated optical fashion on the substrate.

9. The coupling device of claim 1 including
a transparent solid substance which surrounds the photoresist layer.

10. The coupling device of claim 9 wherein
the index of refraction of the transparent solid substance is lower than that of the photoresist layer.

* * * * *